United States Patent [19]
Galbi et al.

[11] Patent Number: 5,255,224
[45] Date of Patent: Oct. 19, 1993

[54] BOOSTED DRIVE SYSTEM FOR MASTER/LOCAL WORD LINE MEMORY ARCHITECTURE

[75] Inventors: Duane E. Galbi, Jericho; Russell J. Houghton, Essex Junction; Richard M. Parent, Shelburne, all of Vt.

[73] Assignee: International Business Machines Corporation, Armonk, N.Y.

[21] Appl. No.: 810,000

[22] Filed: Dec. 18, 1991

[51] Int. Cl.⁵ .............................................. G11C 7/00
[52] U.S. Cl. ........................ 365/189.09; 365/189.11; 365/226
[58] Field of Search ............ 365/189.09, 189.11, 365/230.06, 226; 307/449, 296.1

[56] References Cited

U.S. PATENT DOCUMENTS

| | | | |
|---|---|---|---|
| 4,508,978 | 4/1985 | Reddy | 307/482 |
| 4,639,622 | 1/1987 | Goodwin et al. | 307/482 |
| 4,649,523 | 3/1987 | Holder, Jr. et al. | 365/203 |
| 4,678,941 | 7/1987 | Chao et al. | 307/449 |
| 4,688,063 | 8/1987 | Lu et al. | 357/23.6 |
| 4,704,706 | 11/1987 | Nakano | 365/203 |
| 4,731,552 | 3/1988 | Miyamoto | 307/264 |
| 4,789,648 | 12/1988 | Chow et al. | 437/225 |
| 4,801,988 | 1/1989 | Kenney | 357/23.6 |
| 4,814,647 | 3/1989 | Tran | 307/482 |
| 4,831,592 | 5/1989 | Nakani | 365/189.09 |
| 4,896,297 | 1/1990 | Miyatake et al. | 365/189.11 |
| 4,905,314 | 2/1990 | Kato et al. | 307/264 |
| 4,906,056 | 3/1990 | Taniguchi | 307/482 |
| 4,944,836 | 7/1990 | Beyer et al. | 156/645 |
| 4,954,731 | 9/1990 | Dhong et al. | 307/482 |
| 4,967,399 | 10/1990 | Kuwabara | 365/189.11 |
| 5,010,259 | 4/1991 | Inoue et al. | 307/482 |
| 5,038,325 | 8/1991 | Douglas et al. | 365/189.06 |
| 5,059,816 | 10/1991 | Kobatake | 307/246 |
| 5,159,215 | 10/1992 | Murotani | 365/189.09 |

OTHER PUBLICATIONS

R. Scheuerlein et al., "Offset Word Line Architecture for Scaling DRAMs to the Gigabit Level," Center for Integrated Systems, 1987 Symposium on VLSI Circuits, Session VI-4, pp. 81–82.

Primary Examiner—Eugene R. LaRoche
Assistant Examiner—A. Zarabian
Attorney, Agent, or Firm—Mark F. Chadurjian

[57] ABSTRACT

An integrated boost and local word line drive system that enhances the speed of the word line drive without providing excessive voltage stresses to the driver devices. A charge reservoir stores a boost voltage under the control of a charge pump that is regulated by a voltage regulator. One of the local word lines coupled to a selected master word line is enabled by a driver that receives the boost voltage. The switching times and signal slew rates of the driver, as well as the boost voltage, are controlled to prevent excessive gate stresses in the support circuitry.

29 Claims, 3 Drawing Sheets

BOOSTED DRIVE SYSTEM FOR MASTER/LOCAL WORD LINE MEMORY ARCHITECTURE

CROSS-REFERENCE TO RELATED APPLICATIONS

Reference is made to co-pending U.S. patent application Ser. No. 809,608 filed Dec. 17, 1991 by Galbi et al., entitled "Stable Voltage Reference Circuit With High Vt Devices," filed concurrently herewith and assigned to the assignee of the present invention. This Application relates to circuitry for providing a stable reference voltage offset from a supply voltage by two volts. The circuit is utilized in the present invention to control the charge on the charge reservoir.

BACKGROUND OF THE INVENTION

1. Technical Field

The invention relates to a means for enhancing signal margins when reading information from or writing information to dynamic random access memory (DRAM) cells, and more particularly to a circuit for providing a regulated boost voltage to drive selected local word lines.

2. Background Art

In a conventional DRAM array, the gate electrodes of the transfer devices are connected to a common word line, and the drains of the transfer devices are connected to a common bit line orthogonal to the word line. In reading or writing a selected cell, a word line is selected to turn on the appropriate transfer devices. The charge stored by the storage capacitor is then transferred to (or shared with) the bit line, which will experience a change in charge as a function of the charge stored by the cell and the capacitive coupling ratio between the cell and the bit line. Because this ratio is very low, the bit line voltage does not change by more than 100-200 millivolts or so. As is well known, a sense amplifier then amplifies this small voltage change.

Because of this small voltage difference, it is essential that the storage capacitor store a full rail potential (that is, a full "0" voltage level, typically ground potential, or a full "1" voltage level, typically 5 volts). If the transfer device is an NMOS, a full "1" level will not be stored; the capacitor will store a charge of VDD−Vt (where Vt is the threshold voltage of the device). Typically this problem has been addressed by the use of the so-called "bootstrapping" technique, in which the voltage on the gate or source of the transfer device is boosted to a threshold above Vdd. This enables the NMOS to pass a full VDD to the storage capacitor.

There are numerous references directed to the general idea of generating and applying a word line boost voltage as a clock signal to drive a word line. Of these, some rely on generating the boost voltage by use of a discrete capacitor within the word line driver (See U.S. Pat. No. 4,678,941 "Boost Word-Line Clock and Decoder-Driver Circuits in Semiconductor Memories" by Cao et al.; U.S. Pat. No. 4,639,622, "Boosting Word-Line Clock circuit for Semiconductor Memory," by Goodwin et al.; U.S. Pat. No. 4,814,647 "Fast Rise Time Boosting Circuit" by Tran; and U.S. Pat. No. 4,954,731 "Wordline Voltage Boosting Circuits for Complementary Dynamic RAMs" by Dhong et al.). Some others use a compensated supply to insure that the voltage on the boost capacitor stays relatively constant (see U.S. Pat. No. 4,896,297 "Circuit for Generating A Boosted Signal for a Word Line," by Miyatake et al.). In U.S. Pat. No. 4,649,523, "Semiconductor Memory with Boosted Word Line" by Holder, Jr., et al., a boost voltage is provided to the word lines at both the beginning and the end of the access cycle.

U.S. Pat. No. 5,038,325 "High Efficiency Charge Pump Circuit," by Douglas et al. discloses a boost circuit in which stray and decoupling capacitances are charged to the boost voltage by a charge pump, the output of which passes through a clamp network that maintains the boost voltage at the desired level. The boost circuitry is located in an area removed from the word lines, saving real estate in the memory arrays.

An article by R. Scheuerlien et al., entitled "Offset Word Line Architecture," 1987 *Symposium On VLSI Circuits*, Session VI-4, pg. 81-2, describes a word line drive system which utilizes a high-Vt PMOS as the pull down device for the driver. The array devices have a lower threshold than the support devices, such that they experience a high turnoff voltage to prevent leakage. The array word lines are boosted to one volt below ground. Reliance is placed on the high Vt of the driver device to turn the device off before it can experience high gate stresses. See also U.S. Pat. No. 4,905,314 for a teaching of the use of a high Vt device in a clocking circuit.

As device dimensions further decrease, FETs become more susceptible to failure due to high applied electric fields. At the same time, the boost techniques discussed above tend to establish high electric fields. Thus, a need exists for an efficient word line boost system that minimizes high electric fields.

SUMMARY OF THE INVENTION

It is thus an object of the present invention to drive the word lines of a memory array at high voltages, while minimizing high applied electric fields.

It is also an object of the present invention to generate the boost voltage from a charge reservoir that has a well-controlled capacitance as well as an efficient layout.

The foregoing and other objects of the invention are realized by a word line driver system that provides a boost voltage while minimizing high gate stresses caused by high applied electric fields. In a first aspect of the invention the pullup devices for the local word line driver are not enabled until the associated master word line has been substantially enabled. In another aspect of the invention the pulldown devices of the driver are not enabled until the word line voltage has fallen to the level of the high supply potential. In yet another aspect of the invention the performance of the driver is enhanced by driving the pullup device from a charge reservoir, wherein the pullup device is located within a well region that forms a part of the reservoir to further reduce gate stresses while minimizing the area impact of the reservoir. In a further aspect of the invention, the voltage on the charge reservoir is reduced should the high supply potential be reduced, to further protect against high applied gate stresses.

BRIEF DESCRIPTION OF THE DRAWING

The foregoing and other features of the present invention will become more apparent upon a review of the description of the best mode for carrying out the invention as rendered below. In the description to follow, reference will be made to the accompanying Drawing, in which.

DETAILED DESCRIPTION OF THE BEST MODE FOR CARRYING OUT THE INVENTION

Figure 1:
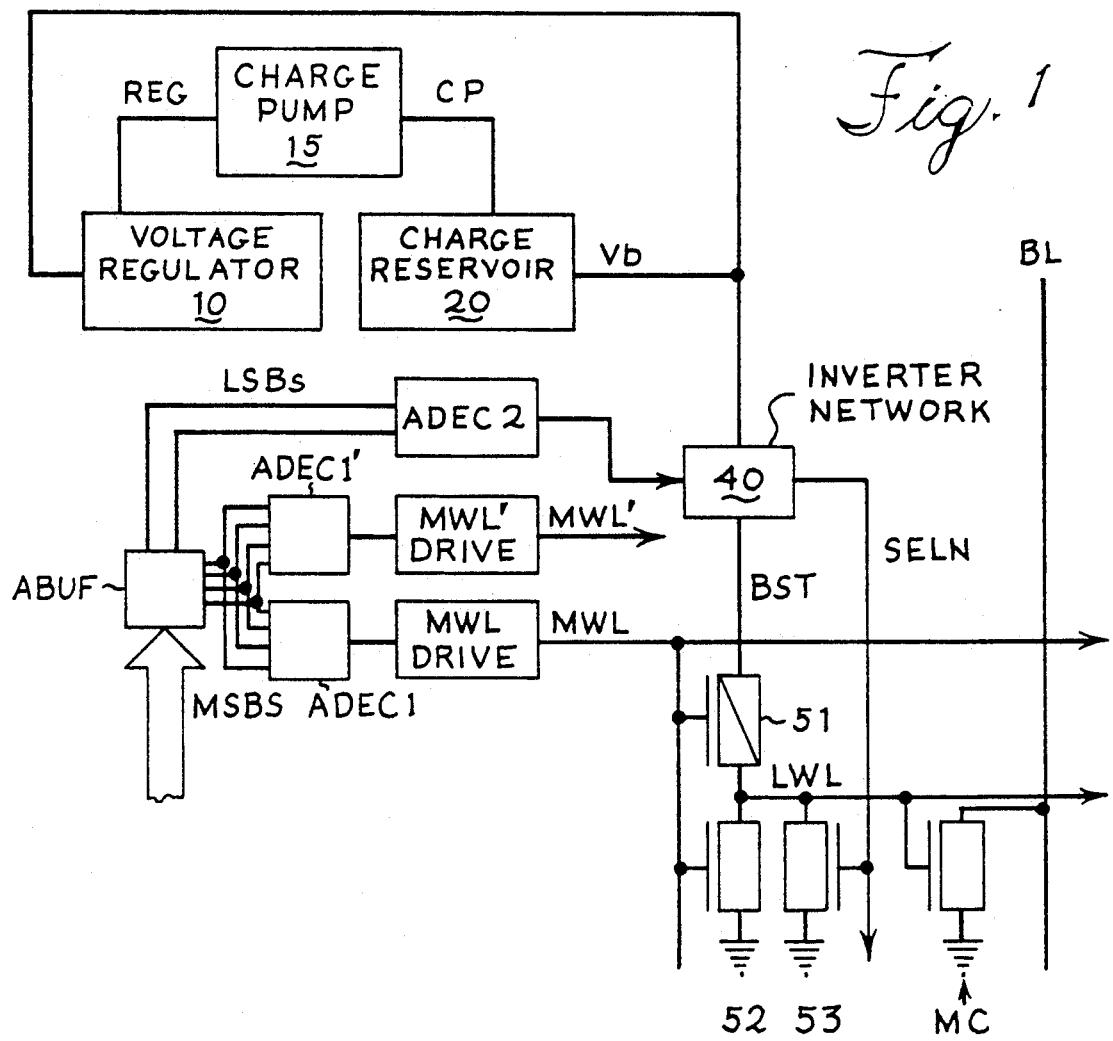
FIG. 1 is a circuit block diagram of the preferred embodiment of the present invention.

FIG. 1 is a circuit block diagram of the preferred embodiment of the invention. A voltage regulator 10 controls a charge pump 15, which in turn controls the charge stored by a charge reservoir 20. As described below with reference to FIG. 4, the voltage regulator 10 monitors the charge reservoir voltage Vb to regulate it at 4 volts, while also correcting for Vdd excursions. The regulator output REG is supplied to a conventional charge pump 15 (see e.g. FIG. 2 (Prior Art) and FIG. 3 (Prior Art) of the aforementioned U.S. Pat. No. 5,038,325) which controls the amount of charge stored by the reservoir 20. As will be discussed in more detail below with reference to FIG. 5, the charge reservoir 20 is a large distributed capacitance made up of a series of decoupling capacitors coupled to a large n-type well region formed in a p-type substrate. In combination, these devices provide a large capacitance that has a capacitance value that can be relatively well controlled in manufacturing the circuit. The decoupling capacitors are of the substrate plate trench cell type, as taught in U.S. Pat. No. 4,688,063 (Lu et al, "Dynamic RAM Cell With MOS Trench Capacitor In CMOS," assigned to IBM) and U.S. Pat. No. 4,801,988 (Kenney, "Semiconductor Trench Capacitor Cell With Merged Isolation And Node Trench Construction," assigned to IBM). The Kenney capacitor structures are preferred in this application. Typically there would be 20-30 thousand decoupling capacitors arranged in an upper portion of each memory array on the memory chip.

The charge reservoir 20 is coupled to an inverter network 40, which is selectively enabled by decoder signals from ADEC2 to provide Vb on output line BST to the source of a p-type FET (PFET) 51, which is the pullup device of a high-Vt local word line driver made up of pullup device 51 and pulldown devices 52, 53. In each array of the memory (preferably a dynamic random access memory (DRAM)), there are four local word lines LWL that are selectively coupled to a master word line MWL. The MWL spans over a number of the arrays. Per conventional practice, external address signals received during the active portion of the Row Address Strobe (RAS) cycle are latched by address buffers ABUF. The most significant bits MSBS (that is, all except the two lowest significance bits) of the address signal are decoded by ADEC1, ADEC1' to select a particular MWL, MWL', respectively. The two lowest significance address bits LSBS are decoded by ADEC2 to select one of the four LWLs coupled to the selected MWL. All of the address decoders are conventional NOR decoders. If ADEC1 determines that MWL is to be selected, it produces a high signal to enable MWL DRIVE (as per standard NOR decode operation, the unselected ADEC1' does not produce an enable signal, such that MWL DRIVE is disabled for that particular access cycle). MWL Drive and MWL' Drive are skewed CMOS inverters, made up of a large NFET device coupled to ground that quickly drives the selected line to an active low, and a small PFET device coupled to Vdd that insures slow deactivation of the selected MWL. The NFET is three times the size of the PFET; given the capacitive loading of MWL, MWL will thus be activated by going low six times faster than it will be deactivated by rising at the end of the access cycle. At the same time, as a function of the state of the decoded LSBs, ADEC2 will provide an enable signal to the respective inverter network 40 coupled to the selected LWL. So, there are a plurality of master word lines, each selectively coupled to four LWLs in each array. By breaking down the word lines into master/local word lines, access speeds are enhanced because the effective time constant of the word lines is reduced. Each LWL is coupled to a relatively small number of memory cells MC. With less capacitive loading, the LWLs can more quickly drive the gates of the memory cells MC.

The local word line driver consists of a first pulldown device 52, a second pulldown device 53, and a pullup device 51. With MWL selected by going low, and with the source of PFET 51 later brought to BST=4 volts, the voltage on LWL will quickly rise to 4 volts. Note that the driver is enabled by turning off n-type FET (NFET) 52 and 53. With LWL at four volts, a full "1" level of 3.3 volts will be transferred between the bit line BL and the storage capacitor of the memory cell MC. When the inverter network for a particular LWL is selected, BST will rise to 4 volts, which is coupled to the source of PFET 51. Note that the array and support circuits are powered at Vdd=3.3 volts; thus, the voltage on BST exceeds Vdd by approximately 0.7 volts.

Note that PFET 51 has a high threshold voltage of 1.6 volts (the other PFETs in the array and support circuits have a threshold voltage of approximately 0.6 volts, as do the NFETs). This high threshold PFET is fabricated in its own N-well, with a shallow n-type channel tailor implant of phosphorus ions. Note that while other techniques such as utilizing n-type and p-type polysilicon as the gate materials of the different PFETs could be used to induce a threshold difference, in the invention channel implantation is preferred because of its lower cost when used to construct high density DRAMs. By using a high Vt device as the driver pullup, the off drive of unselected drivers will increase, insuring that unselected drivers stay off when the voltage on BST rises to 4 V and the unselected MWL stays at 3.3 V. More specifically, by using a high Vt device, the voltage difference between the gate and the source must now be 1.6 volts for an unselected driver to turn on, greatly decreasing the likelihood that this will occur.

A feature of the driver is that the signal timings and slew rates are controlled such that the driver devices are not stressed at high voltages. The invention is intended for use in a sub-0.5 micron, CMOS process. In order to reduce gate stresses while retaining high switching speeds, the gate oxides of the FETs are reduced in thickness, and the applied voltages Vdd are reduced from 5 volts to 3.3 volts. Because of their thin oxides, as well as their reduced channel dimensions, such FETs are susceptible to failure due to high electric fields across the gate dielectrics (causing dielectric breakdown) and high source—drain or diffusion—substrate potential differences (causing hot electron injection and short channel effects). All of these failure mechanisms can be controlled at least in part by controlling applied signals such that high E fields and differential potentials are not applied.

In the invention, this is achieved as follows:

1) At the start of the access cycle, the timing of the signals on the MWL and BST lines is controlled such that BST signal rises only after the MWL voltage has substantially dropped to zero. In practice, this is achieved by sizing the MWL Drive devices as discussed above, such that the MWL signal falls very quickly at the start of the access cycle relative to the activation of device 51 by BST going high. Note that other techniques could be used, such as including a DUMMY MWL circuit that simulates the worst-case delay between when the address signals are received and when the selected MWL falls. Similarly, the slew rate (or rise/fall times) of the BST signal is controlled by sizing the devices of the inverter network 40 (see discussion of FIG. 2 below) such that BST does not rise until the selected MWL has been substantially activated (i.e. has fallen to approximately a low threshold voltage above ground). Using these techniques insures that the drain-to-source voltage across device 51 does not exceed approximately 3.6 volts at any time during the turn-on cycle.

2) In order to prevent gate stresses across PFET 51, we want LWL to fall with BST to under 3.6 volts, which can only happen with MWL still active. So, as previously stated, the MWL DRIVE is sized such that MWL rises slowly at the end of the activation cycle relative to BST being driven low by the inverter network 40. As BST falls, LWL follows to a voltage less than Vdd, before MWL has risen significantly. As will be described in more detail in conjunction with FIG. 2, the inverter network 40 includes a circuit that delays the rise in SELN to be after the fall of BST, such that device 53 turns on only after the LWL voltage has dropped below Vdd and device 51 is at least partially turned off. Also, as MWL rises, PFET 51 will turn off, allowing LWL to be completely pulled to ground by device 52.

As discussed above, these timing sequences can be produced using common AND/OR logic, and the signal slew rates can be controlled by sizing the output FETs appropriately (that is, the output CMOS pullup and pulldown devices have different channel widths/lengths, such that the resulting signal has controllable rise and fall times).

Figure 2:
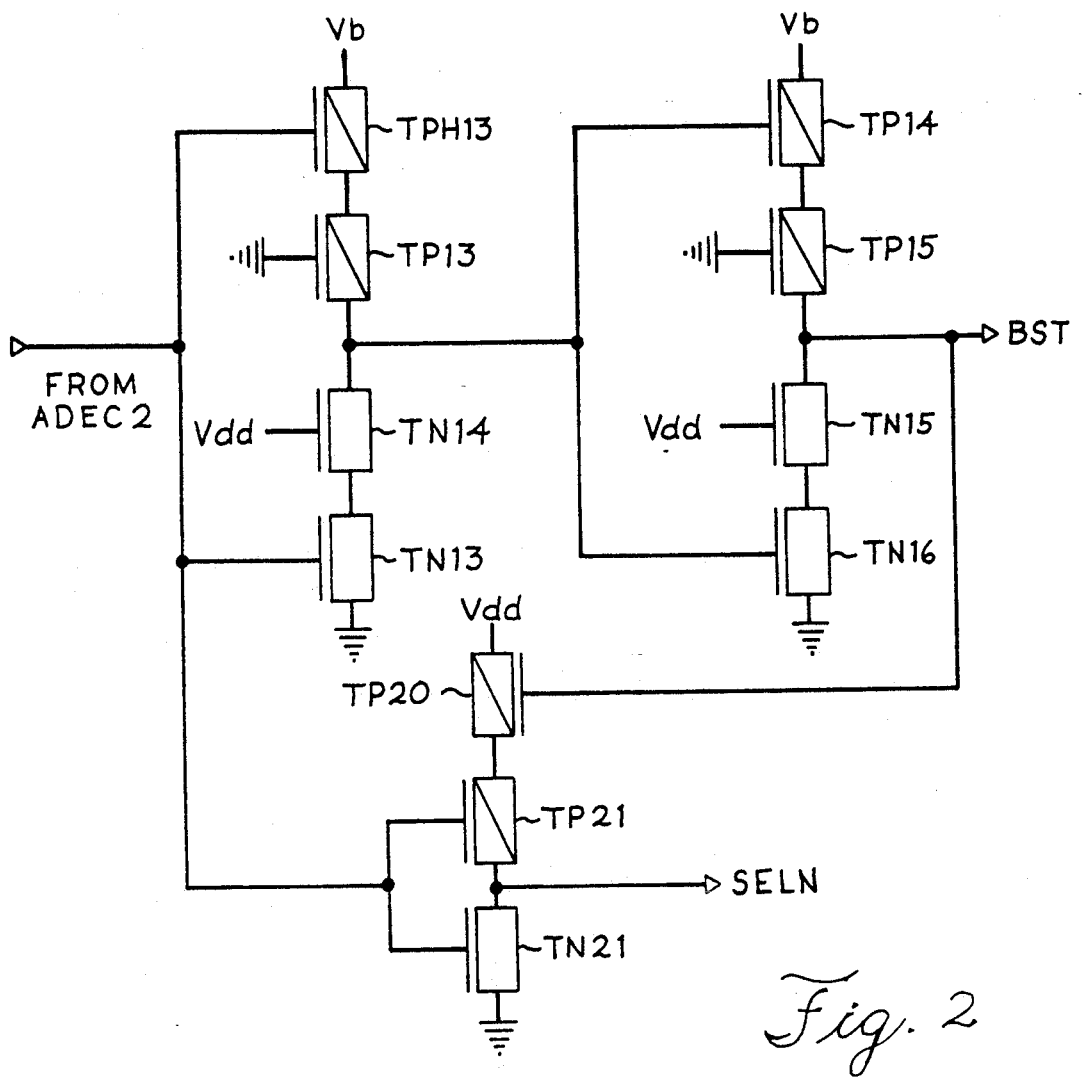
FIG. 2 is a circuit diagram of the inverter network 40 of FIG. 1.

FIG. 2 is a circuit diagram of the inverter network 40 shown in FIG. 1. In general, the PFETs and NFETs in the input inverter leg are the same size, and the PETs are stronger (i.e. higher transconductance, or current carrying capacity) than the NFETs by a ratio of approximately 1.4:1 in the output inverter leg that produces BST. As such, BST will rise only approximately 1.4 times faster than it will fall (recall that the MWL DRIVE devices are sized such that MWL falls, or becomes active, approximately six times faster than it rises). The output of ADEC2 is sent to the gate of TPH13 as well as TN13 of the first leg of the inverter. The high-Vt device (Vt=1.6 V) TPH13 insures that the pull-up portion of the inverter can switch between the VB voltage applied at the source and ground, if the gate signal is high. Note that all of the P devices are disposed in N-wells biased to VB (not shown). Devices TP13 and TN14, as well as devices TP15 and TN15 in the output inverter leg, have their gates coupled to respective Vdd and ground power supplies. These devices provide additional diode drops between the outputs of the respective inverter legs and the switching devices TPH13, TN13, TP14, and TN16, respectively do not see drain-to-source voltages in excess of 3.6 V as the respective legs switch between high and low voltage states. See e.g. U.S. Pat. No. 4,508, 978, "Reduction of Gate Oxide Breakdown for Booted Nodes in MOS Integrated Circuits," issued April 1985 to Reddy and assigned to Texas Instruments. When ADEC2 rises, device TN13 will turn on and device TPH13 will turn off, such that a low potential is applied to the output inverter leg. TP14 will turn on and TN16 will turn off, such that the BST output rises to VB. Since the capacitive load (BST+LWL) driven by the inverter network has approximately twice the loading of the capacitive load (MWL) driven by MWL DRIVE, and since as described above the MWL DRIVE CMOS inverter is sized to activate MWL DRIVE quickly, in practice MWL will be within a Vt (+0.6 volts) of ground before BST begins to rise.

The BST output also controls the gate of PFET TP20, and the output of ADEC2 also controls the gates of an inverter made up of TP21 and TN21, all of which control the SELN signal that controls the pulldown device 53 of the LWL driver. These devices are approximately the same size. At the start of the cycle, if a particular LWL is selected as indicated by the output of ADEC2 going high, SELN can go low to disable device 53, facilitating driving LWL by device 51 by isolating LWL from ground. At the end of the cycle, ADEC2 will fall, which starts BST falling. But because BST is at four volts at the start of the deactivation cycle, TP20 will not turn on until BST has fallen to a Vt below Vdd. Therefore, SELN does not rise (hence device 53 does not turn on) until BST has fallen substantially, again reducing gate stresses.

Figure 3:
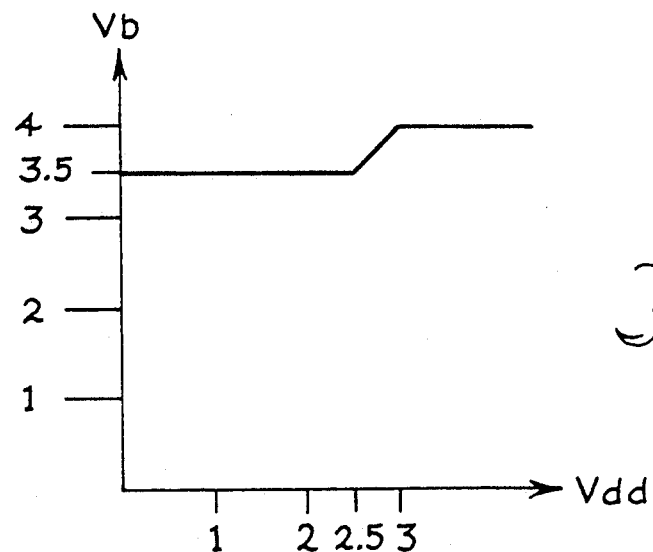
FIG. 3 is a graph of the voltage Vb of the charge reservoir 20 versus Vdd.

FIG. 3 is a graph of Vb, the voltage stored by the charge reservoir 20, versus the high supply voltage Vdd. Note that Vb is constant for Vdd>3 volts, below which Vb falls with falling Vdd until it is at 3.5 volts for Vdd=2.5 volts or below. This prevents the high Vt FETs from operating in the subthreshold region, to minimize stress failures. The voltage regulator 10 must control the charge pump 15 such that Vb achieves this characteristic.

Figure 4:
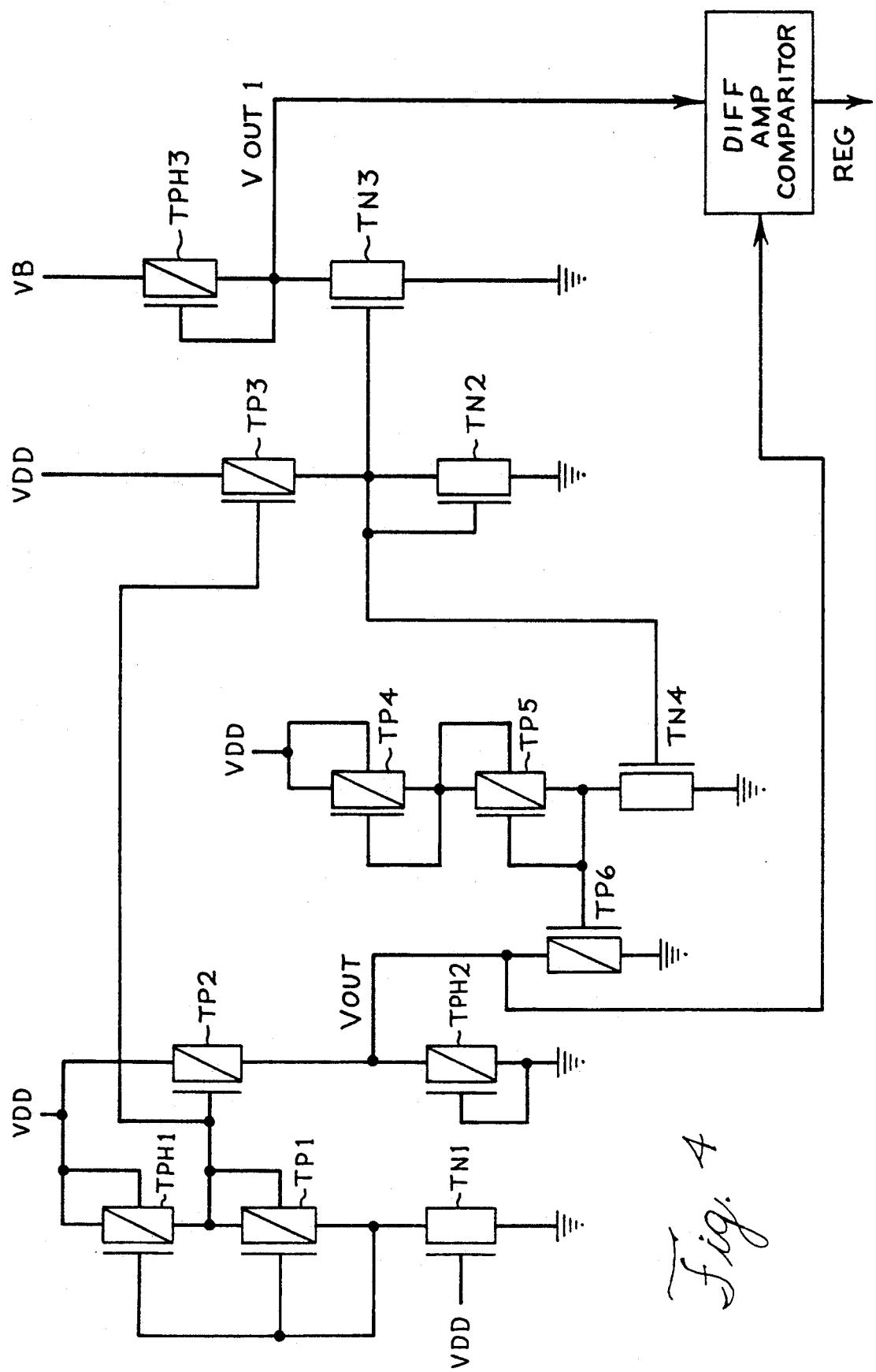
FIG. 4 is a circuit diagram of the voltage regulator 10 of FIG. 1.

With reference to FIG. 4, the voltage regulator 10 circuit of the invention is shown. This circuit utilizes both embodiments of the reference voltage generator that is the subject of the aforementioned U.S. patent application Ser. No. 809,608 by Galbi et al. The first leg of the circuit consists of devices TPH1, TP1, and TN1. Device TN1 has its gate coupled to Vdd (=3.3 volts), and thus serves as a current source for the first leg. The gates of both TPH1 and TP1 are connected between the drain of TP1 and the drain of TN1, and the source of TP1 is connected to the drain of TPH1. The source of TPH1 is connected to Vdd. TPH1 and TP1 have substantially the same transconductances (or current carrying characteristics, which is the product of channel characteristics such as doping, area, charge mobility, etc. and gate characteristics such as gate oxide thickness etc.). Thus they have the same current flowing through them (approximately 5 microamps) from TN1.

TPH1 and TP1 operate in the saturation region at the current flow induced by TN1. At the 5 microamp current induced by TN1, both TPH1 and TP1 provide a diode drop across them that is equivalent to their respective threshold voltages. The threshold voltage of TPH1 is approximately 1.6 volts, and that of TP1 is approximately 0.6 volts. Thus, the voltage drop between the source of TPH1 and its gate (i.e., at the drain of TP1, because of the interconnection to the gate of TPH1) will be 1.6 volts, the Vt of TPH1, and the voltage drop between the source and drain of TP1 is 0.6 volts, the Vt of TP1. As such, the voltage at the source of TP1 is (Vdd+ −1.6+0.6), or Vdd minus one volt. The voltage on the source of TP1 biases the gate electrode of TP2 of the second leg of the circuit of the invention.

Note that the description above was for steady state conditions in which Vdd is substantially constant. Should Vdd increase significantly, the current supplied by TN1 will increase and the overdrive on TPH1 and TP1 will correspondingly increase. However, the overdrive of TPH1 and TP1 compensate each other, resulting in a constant voltage of Vdd−1 at the source of TP1 that is immune to VDD excursions.

The first output leg of the reference voltage generator converts the Vdd−1 voltage on the gate of TP2 to an output voltage of 2 volts above ground potential. The output leg includes TP2, which has a source coupled to Vdd and a drain coupled to the output, and TPH2, which has its gate and drain coupled to ground and its source coupled to the output. Since the gate of TP2 is at a voltage of one volt below Vdd, strictly speaking it is not diode connected because the source and gate are not at the same voltage. However, because of this constant voltage applied at the gate of the device, the transistor will operate in the saturation regions, exhibiting a current at the drain. This current generates the same overdrive on TPH2, because similarly to the first leg as described above TPH2 and TP2 are made to have substantially the same transconductance. Because the voltage on the gate of TP2 is below the source by one volt, and the threshold of TP2 is 0.6 volts, the overdrive voltage to TPH2 will be at a voltage of 1.0–0.6, or 0.4 volts. Since as explained above the overdrive to TPH2 is also 0.4 volts, and it has a threshold of 1.6 volts and is connected in a diode configuration, the voltage at Vout is 1.6 plus 0.4, or two volts. Note that the drop across TPH1 is due to the diode characteristic and the supplied overdrive, such that the output voltage is independent of Vdd.

The second part of the voltage reference circuit supplies an output voltage Vout1 that is two volts below the boost voltage VB stored by the charge reservoir 20. Devices TP3 and TPH3 have similar transconductances, as do devices TN2 and TN3, such that by virtue of their gate interconnections TN2 and TN3 provide a current mirror function. As such, the currents in the second and third legs of the circuit are the same. Device TPH3 sees the same overdrive voltage as did device TPH2 in FIG. 1, such that the same 0.4 overdrive voltage plus 1.6 volt diode drop is generated across TPH3. However, because TPH3 is coupled to the boost supply Vb, the output Vout⊥ is two volts below Vb, (i.e., 2 volts when Vb is 4 volts), rather than two volts above ground output Vout of the first output leg of the invention.

In the third part of the voltage regulator, TN4 has its gate coupled to the gates of TN2 and TN3. PFETs TP4 and TP5 pass the same current as does TPH3, because devices TN2–TN4 have substantially similar transconductances. Recall that this current is the same as the current flowing through TN1 and TP2. Moreover, device TP4 is made to have a transconductance that is substantially similar to TP2, such that it has the same 1 V drop across it (recall that TP2 provided an overdrive of 0.4 V, and had the threshold drop of 0.6 V). As such, the source of TP4 is at the same Vdd−1 voltage as the gate of TP2. The transconductance of TP5 is much larger than TP2, so the drain to source voltage of TP2 is nearly equal to the Vt of TP2 (0.6 V) (i.e., as the size of an FET increases, the voltage as a function of overdrive decreases, to the point where Vt+Voverdrive≅Vt). Hence, the gate of TP6 is at Vdd-1v-Vtp. Since TP6 is also a large device, if the source of TP6 (i.e., the 2 volt reference) exceeds Vdd-1V-Vtp by a Vt then TP6 will be on. In other words, for TP6 to turn on with the source at 2 volts, Vdd-1V-Vtp has to be less than 1.4 volts, which can only happen if Vdd were to fall below 3 volts. With TP6 on, Vout will fall from 2 volts to +Vt volts. TP6 is large enough such that the overdrive required to sink the current supplied by TP2 is small compared to the Vt of TP6. In essence, the third part of the voltage reference circuit establishes a comparison voltage based on a current (induced by TN2-TN4) that is relatively independent of Vdd, adding a dependency on Vdd by devices TP4-TP5, such that TP6 only turns on to drop Vout below 2 volts if Vdd has fallen below 3 volts.

Note that the outputs Vout and Vout1 go to a comparitor which utilizes a conventional differential amplifier to determine which voltage is lower than the other, and to produce corresponding control signals REG for the charge pump 15. Steady state, both voltages should equal two volts (Vout=0+2 V, Vout1=4 V−2 V). REG rises to activate the charge pump if Vout>Vout1, and REG stays high (such that the pump continues to pump charge into the charge reservoir 20 to increase Vb) active until the voltages are equal. REG falls to deactivate the charge pump if Vout<Vout1, and REG stays low (allowing charge to leak off the charge reservoir 20, to reduce Vb) until the voltages are again equal.

Figure 5:
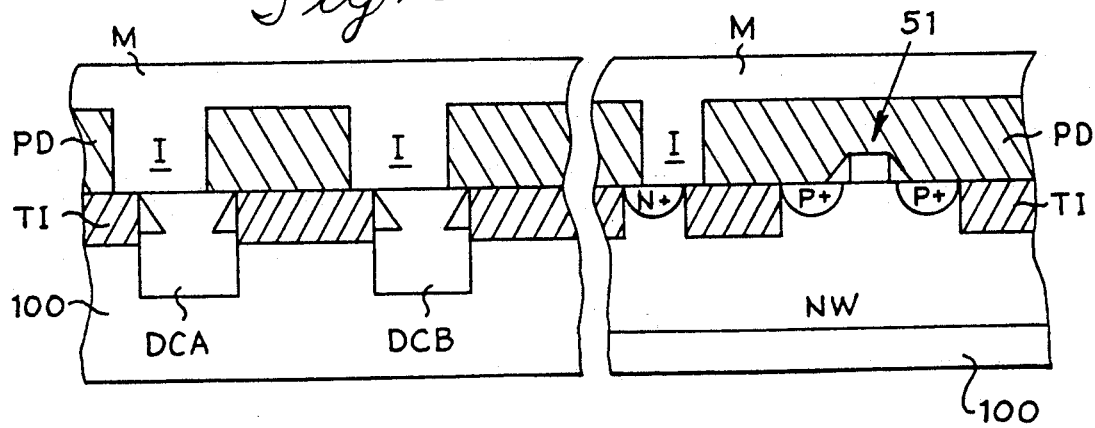
FIG. 5 is a cross-sectional view of the charge reservoir 20 of FIG. 1.

FIG. 5 is a cross-sectional view of a portion of the charge reservoir 20 of the invention. As previously stated, the charge reservoir is constructed from two main components, a series of decoupling capacitors DCA and DCB and an n-well NW, all of which are formed in a substrate 100. An interconnect line M is coupled to the charge pump output CP, which in turn is coupled through vertical interconnects I to the trench decoupling capacitors DCA, DCB. Note that since the decoupling capacitors are formed using the same process steps as the trench storage capacitors of the memory cells MC, they have the same trench isolation TI for trench-to-trench leakage prevention as in the arrays. The interconnects I (as well as the planarized dielectric structure PD) can be formed in the manner disclosed in U.S. Pat. No. 4,789,648 (Chow et al, "Method For Producing Coplanar Multi-Level Metal/Insulator Films On A Substrate And For Forming Patterned Conductive Lines Simultaneously With Stud Vias,") and U.S. Pat. No. 4,944,836 (Beyer et al, "Chem-Mech Polishing Method For Producing Coplanar Metal/Insulator Films On A Substrate,") both assigned to IBM. The interconnect M is also coupled to the N-well NW through an N+ type contact interconnect diffusion region. NW is 20 microns wide and 500 microns long, and it has 256 contact/PFET pairs. Note also that by including the parasitic capacitance of the N-well as part of the charge reservoir, the pullup device 51 is disposed in a region that is biased to the boost voltage, further preventing overvoltage conditions.

By virtue of the combination of structures shown in FIG. 5, the charge reservoir has a large capacitance that is approximately 40 times the capacitance of LWL. As such, the charge reservoir will pull the LWL voltage to the voltage on BST very quickly (subject to the slew rate control to prevent overvoltage conditions, as described previously). The use of this charge reservoir provides a very consistent boost voltage as compared to the discrete capacitor structures used in many boost circuits. In particular, by using a combination of decoupling capacitors and the N-well parasitics, charge reservoir of the invention provides a discrete capacitance while also optimizing the rise time of LWL.

Thus, the invention presents an integrated voltage boost and word line drive system that enhances the speed at which local word lines can be selected and driven, without stressing the drive devices at voltages exceeding the external high voltage supply.

Various modifications may be made to the teachings as rendered above without departing from the spirit and scope of the present invention. For example, more than four LWLs could be coupled to a single MWL in each array. The hot electron protect devices in the inverter network could be deleted by sizing the switching FETs to control slew rates.

We claim:

1. A memory system receiving both a high supply voltage and a low supply voltage from an external source, the memory system accessing a particular one of a plurality of memory cells during an access cycle, the memory system comprising:

a plurality of local word lines, each of which is interconnected to different ones of the plurality of memory cells;

a plurality of master word lines, each coupled to selected ones of said local word lines;

first selection means for selecting one of said plurality of master word lines;

second selection means for selecting one of said plurality of local word lines coupled to a selected one of said plurality of master word lines; and a charge reservoir for storing charge at a boost voltage exceeding the high supply voltage, said second selection means including a driver transistor for coupling said boost voltage to said selected one of said plurality of local word lines, said driver transistor having a gate electrode coupled to said selected one of said plurality of master word lines, a first controlled electrode coupled to said selected one of said local word lines, and a second controlled electrode that is biased at said boost voltage only after said selected master word line has been substantially activated.

2. The memory system of claim 1, wherein said first selection means decodes most significant bits of an address signal.

3. The memory system of claim 2, wherein said second selection means decodes two least significant bits of said address signal.

4. The memory system of claim 1, wherein said second selection means further comprises a pulldown transistor having a gate electrode receiving an enable signal when said selected one of said plurality of local word lines is to be deactivated, a first controlled electrode coupled to said low supply voltage, and a second controlled electrode coupled to said selected one of said plurality of local word lines.

5. The memory system of claim 4, wherein said second controlled electrode of said pulldown transistor does not receive said enable signal until said selected one of said plurality of local word lines is at a voltage below said high supply voltage.

6. The memory system of claim 5, wherein at the end of the access cycle said second controlled electrode of said driver transistor receives the low supply voltage, and wherein said selected one of said plurality of master word lines is not substantially deactivated until said second controlled electrode of said driver transistor has fallen in voltage to approximately said high supply voltage.

7. The memory system of claim 1, wherein said memory system is formed on a substrate, and said charge reservoir comprises a plurality of discrete decoupling capacitors and a well region formed in said substrate, said driver transistor being located within said well region.

8. The memory system of claim 1, further comprising means for regulating said stored charge on said charge reservoir such that it remains constant at said boost voltage when said high supply voltage is above approximately 3 volts, and it falls to approximately 0.5 volts below said boost voltage as said high supply voltage falls from approximately 3 volts to approximately 2.5 volts, and it remains constant at approximately 0.5 volts below said boost voltage should said high supply voltage fall below approximately 2.5 volts.

9. An integrated circuit memory system formed on a substrate, receiving both a high power supply and a low power supply, the memory system comprising:

a plurality of memory cells, each coupled to a given one of a plurality of local word lines;

a plurality of master word lines, each coupled to a set of said plurality of local word lines;

first means for activating a selected one of said plurality of master word lines;

second means for activating a selected one of said plurality of local word lines from said set of said plurality of local word lines coupled to said selected one of said plurality of master word lines, said second means including boost means for setting a voltage on said selected one of said plurality of local word lines at a boost level greater in absolute value than the high power supply;

said second means activating said boost means after said selected one of said plurality of master word lines has been substantially activated, and deactivating said boost means before said selected one of said plurality of master word lines has been substantially deactivated.

10. The integrated circuit memory system of claim 9, further comprising a charge reservoir for storing charge at a voltage at said boost level, said charge reservoir being coupled to a plurality of said second means.

11. The integrated circuit memory system of claim 10, further comprising means for regulating said stored charge on said charge reservoir such that it remains constant at said boost voltage when said high supply voltage is above approximately 3 volts, and it falls to approximately 0.5 volts below said boost voltage as said high supply voltage falls from approximately 3 volts to approximately 2.5 volts, and it remains constant at approximately 0.5 volts below said boost voltage should said high supply voltage fall below approximately 2.5 volts.

12. The integrated circuit memory system of claim 10, wherein said second means comprises a first FET having a gate electrode coupled to said selected one of said plurality of master word lines, a first controlled electrode coupled to said boost means, and a second controlled electrode coupled to said selected one of said plurality of local word lines.

13. The integrated circuit memory system of claim 12, wherein said first FET is formed in a well region in the substrate.

14. The integrated circuit memory system of claim 10, wherein said charge reservoir comprises a plurality of decoupling capacitors formed in the substrate.

15. The integrated circuit memory system of claim 13, wherein said charge reservoir comprises a plurality of decoupling capacitors that are coupled to said well region.

16. The integrated circuit memory system of claim 12, wherein said first means comprises fourth means for decoding a plurality of address signals, and fifth means coupled between said fourth means and one of said plurality of master word lines for controlling the activation and deactivation thereof in response to said fourth means.

17. The integrated circuit memory system of claim 16, wherein said fifth means causes said selected one of said plurality of master word lines to be activated at a rate that is faster than a rate at which it is deactivated at the end of an access cycle.

18. The integrated circuit memory circuit of claim 12, wherein said boost means comprises first and second inverters coupled in series, said second inverter producing a voltage input to said first controlled electrode of said first FET that rises at a rate that is faster than a rate at which it falls at the end of an access cycle.

19. An integrated memory system formed on a substrate, comprising:
a plurality of local word lines, each of which is coupled to a plurality of memory cells;
a plurality of master word lines, each of which is coupled to a set of said plurality of local word lines;
a first FET having a gate electrode coupled to one of said plurality of master word lines, a first controlled electrode coupled to one of said plurality of local word lines, and a second controlled electrode;
first means for biasing said second controlled electrode of said first FET at a boost voltage after said one of said plurality of master word lines has been enabled;
a second FET having a gate electrode receiving a control signal, a first controlled electrode coupled to said one of said plurality of local word lines, and a second control electrode coupled to a first voltage sufficient to deactivate said one of said plurality of local word lines; and
second means for producing said control signal so that said second FET does not turn on until after said first means no longer biases said second controlled electrode of said first FET at said boost voltage.

20. The integrated memory system of claim 19, wherein said first means comprises a charge reservoir for storing charge at said boost voltage.

21. The integrated memory system of claim 20, wherein said first means further comprises means for regulating said stored charge on said charge reservoir such that it remains constant at said boost voltage when said high supply voltage is above approximately 3 volts, and it falls to approximately 0.5 volts below said boost voltage as said high supply voltage falls from approximately 3 volts to approximately 2.5 volts, and it remains constant at approximately 0.5 volts below said boost voltage should said high supply voltage fall below approximately 2.5 volts.

22. The integrated memory system of claim 20, wherein said charge reservoir comprises a plurality of decoupling capacitors formed in the substrate.

23. The integrated memory system of claim 22, wherein said plurality of decoupling capacitors are coupled to a separate well region in the substrate.

24. The integrated memory system of claim 23, wherein said first FET is formed in said well region.

25. The integrated memory system of claim 19, wherein said first means biases said second controlled electrode of said first FET at said first voltage, before said one of said plurality of master word lines is disabled.

26. The integrated memory system of claim 19, wherein said first FET has a first threshold voltage, and wherein said second FET has a second threshold voltage that is less in absolute value than said first threshold voltage.

27. The integrated memory system of claim 26, wherein said first threshold voltage is approximately 1.6 volts, and second threshold voltage is approximately 0.6 volts.

28. The integrated memory system of claim 19, wherein said first means comprises first and second series connected inverters receiving an enable signal, said second inverter being coupled to said boost voltage.

29. The integrated memory system of claim 28, wherein said second means comprises a third CMOS inverter receiving said enable signal, wherein said third inverter is coupled to a power supply through a third FET that receives an output of said second inverter at a gate electrode thereof.

* * * * *